(12) United States Patent
Partsch et al.

(10) Patent No.: US 6,653,875 B2
(45) Date of Patent: Nov. 25, 2003

(54) METHOD AND APPARATUS FOR A DELAY LOCK LOOP

(75) Inventors: Torsten Partsch, Chapel Hill, NC (US); George W. Alexander, Durham, NC (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/095,318

(22) Filed: Mar. 11, 2002

(65) Prior Publication Data

US 2003/0169085 A1 Sep. 11, 2003

(51) Int. Cl.[7] .................................................. H03L 7/06
(52) U.S. Cl. ........................ 327/158; 327/149; 327/161
(58) Field of Search ............................... 327/158, 149, 327/152, 153, 154, 146, 161

(56) References Cited

U.S. PATENT DOCUMENTS 5,646,564 A * 7/1997 Erickson et al. ............ 327/158
5,790,612 A * 8/1998 Chengson et al. .......... 375/373
6,400,616 B1 * 6/2002 Tamura et al. .............. 365/198

* cited by examiner

Primary Examiner—Timothy P. Callahan
Assistant Examiner—Cassandra Cox
(74) Attorney, Agent, or Firm—Thomas R. FitzGerald, Esq.

(57) ABSTRACT

A delay lock loop circuit includes a forward delay circuit receiving a reference clock signal and issuing a delayed clock signal. The forward delay circuit adjustably shifts in time the delayed clock signal relative to the reference clock signal. An inverter receives the delayed clock signal and issues an inverted delayed clock signal. A feedback delay circuit receives a selected one of the delayed and the inverted delayed clock signals, and issues a feedback clock signal that is shifted in time relative to the selected one of the delayed and the inverted delayed clock signals. The feedback clock signal is compared to the reference clock signal. The time shift of the delayed clock signal is adjusted to thereby time-align the reference clock signal and the feedback clock signal.

13 Claims, 4 Drawing Sheets

METHOD AND APPARATUS FOR A DELAY LOCK LOOP

FIELD OF THE INVENTION

The present invention relates generally to integrated circuits, and, more particularly, to a delay lock loop circuit.

BACKGROUND OF THE INVENTION

Clock signals are used in virtually every integrated circuit (IC) to control the operational timing of the IC and/or the transfer of data within and between ICs. For example, all individual circuits or devices, such as, for example, flip-flops and/or latches, in a given IC may change state on a single rising or falling edge of a common clock signal. Relatively large ICs, such as, for example, memory chips, programmable logic arrays, or any other IC that requires clock skew adjustment, include thousands or even millions of such individual circuits or devices. The clock signal is typically applied to a clock input pin of the IC for distribution to each of those numerous devices throughout the IC. Thus, the clock signal is transmitted or propagated from the clock input pin to devices on the IC that are both relatively near to and relatively distant from the clock input pin. By the time the clock signal reaches the devices that are disposed on portions of the IC that are relatively remote from the input pin, the clock signal is likely to have suffered significant propagation delay.

The clock signal received at the IC clock input is hereinafter referred to as the input or reference clock signal REF_CLK, whereas the clock signal received by the last-served device on the IC is hereinafter referred to as the propagated clock signal P_CLK. The propagation delay between the REF_CLK and P_CLK signals, designated hereinafter as $t_p$, may cause difficulties in interfacing between ICs and/or slow down the overall operating speed of a system. For example, data may be provided or input to an IC in a time-aligned manner relative to the reference clock signal, whereas data output from the IC is likely to be provided in a time-aligned manner with the propagated clock signal.

The propagation delay $t_p$ for a particular IC is dependent at least in part upon the configuration of that particular IC. Thus, for a given IC operating at standard or rated operating conditions, temperatures, and voltages, $t_p$ will generally not vary substantially. However, $t_p$ will vary due to external factors, such as, for example, changes in ambient temperature, package temperature, and/or applied voltage. It is beneficial to compensate for the effect of such external factors on the propagation delay $t_p$ of the reference clock signal by aligning in time the propagated clock signal P_CLK of an IC with the reference clock signal REF_CLK. Delay lock loop circuits are one way in which such time alignment of signals is performed.

Delay lock loop (DLL) circuits receive the reference clock signal REF_CLK and produce an output clock signal CLK_OUT that is advanced or delayed relative to the reference clock signal REF_CLK. For convenience, all signals produced by a DLL will hereinafter be referred to as being delayed relative to the REF_CLK signal regardless of whether the particular signal is actually advanced or delayed relative to the reference clock signal. A DLL delays the output clock signal CLK_OUT by an amount of time that is approximately equal to the propagation delay $t_p$ of the IC, i.e., the amount of time required for the reference clock signal REF_CLK to propagate through the IC under standard or normal operating conditions. Further, a DLL adjusts the CLK_OUT signal to compensate for changes in $t_p$ due to the aforementioned external factors. Devices formed on portions of the IC that are proximate the clock input pin are typically supplied with the REF_CLK signal, whereas devices formed on portions of the IC relatively distant from the input clock signal are typically supplied with the CLK_OUT signal. Thus, all devices on the IC receive clock signals that are aligned in time.

The DLL adjusts the amount of time by which the CLK_OUT signal is delayed relative to the REF_CLK signal by comparing the REF_CLK signal to a feedback clock signal FB_CLK. The FB_CLK signal is essentially a delayed version of the CLK_OUT signal. The FB_CLK signal is delayed by a feedback delay circuit that models the propagation delay through an integrated circuit. The time delay of the FB_CLK signal relative to the CLK_OUT signal is, for example, proportional or equal to the propagation delay $t_p$ of the IC under the predefined operating conditions. As the external factors affect the propagation delay through the IC, they also affect the time delay introduced by the feedback delay circuit.

The CLK_OUT signal is essentially a delayed version of the REF_CLK signal. The delay of the CLK_OUT signal is adjusted by a forward delay circuit having a forward delay line, such as, for example, a predetermined number of buffers or invertors connected together in series. The length of the forward delay line is adjusted based upon a comparison of the REF_CLK signal to the feedback clock signal FB_CLK, to thereby adjust the delay of the CLK_OUT signal and to align in time the CLK_OUT signal to the REF_CLK signal at the end of the clock tree. Thus, changes in the propagation delay due to the external factors are compensated for and the clock signals are time-aligned across a range of operating conditions and parameters.

In designing DLLs, a tradeoff between conflicting design goals has heretofore been required. The first design goal of a conventional DLL is to provide a maximum delay time approximately equal to the longest anticipated cycle time (i.e., the lowest operating frequency) of the REF_CLK signal to ensure alignment under worst-case operating conditions. The second design goal is to provide high resolution, i.e., small time increments, in the adjustment of the delay of the CLK_OUT signal, to maximize alignment of the clocks and, therefore, the operating speed of the IC. Satisfying both of those goals results in a DLL that requires a delay line with a multitude of power-consuming delay stages. The multitude of delay stages provides the desirable high resolution and wide frequency adjustment range, but consumes large amounts of power and time to reach a locked state wherein the clock signals are aligned in time. Further, such long delay stages consume valuable space on the substrate of the integrated circuit.

Therefore, what is needed in the art is a DLL that achieves a relatively high resolution with relatively few delay stages.

Furthermore, what is needed in the art is a DLL that achieves a given delay time with fewer delay stages.

Moreover, what is needed in the art is a DLL that consumes less power for a given amount of delay time and/or for a given resolution.

SUMMARY OF THE INVENTION

The present invention provides a delay lock loop circuit for time-aligning a reference clock signal and an internal feedback clock signal that tracks changes in the propagation delay of an integrated circuit.

The invention comprises, in one form thereof, a forward delay circuit receiving the reference clock signal and issuing a delayed clock signal. The forward delay circuit adjustably shifts in time the delayed clock signal relative to the reference clock signal. An inverter receives the delayed clock signal and issues an inverted delayed clock signal. A feedback delay circuit receives a selected one of the delayed and the inverted delayed clock signals, and issues the feedback clock signal that is shifted in time relative to the selected one of the delayed and the inverted delayed clock signals. The feedback clock signal is compared to the reference clock signal. The time shift of the delayed clock signal is adjusted to time-align the feedback clock signal and the reference clock signal, thereby time-aligning a clock signal at the end of the clock tree with the reference clock signal.

An advantage of the present invention is that it achieves a relatively high resolution with relatively few delay stages.

Another advantage of the present invention is that time-alignment of the signals is achieved with fewer delay stages.

Yet another advantage of the present invention is a reduction in power consumption for a given amount of delay time and/or for a given resolution.

BRIEF DESCRIPTION OF THE DRAWINGS

The above-mentioned and other features and advantages of this invention, and the manner of attaining them, will become appreciated and be more readily understood by reference to the following detailed description of one embodiment of the invention in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE DRAWINGS

Figure 1:
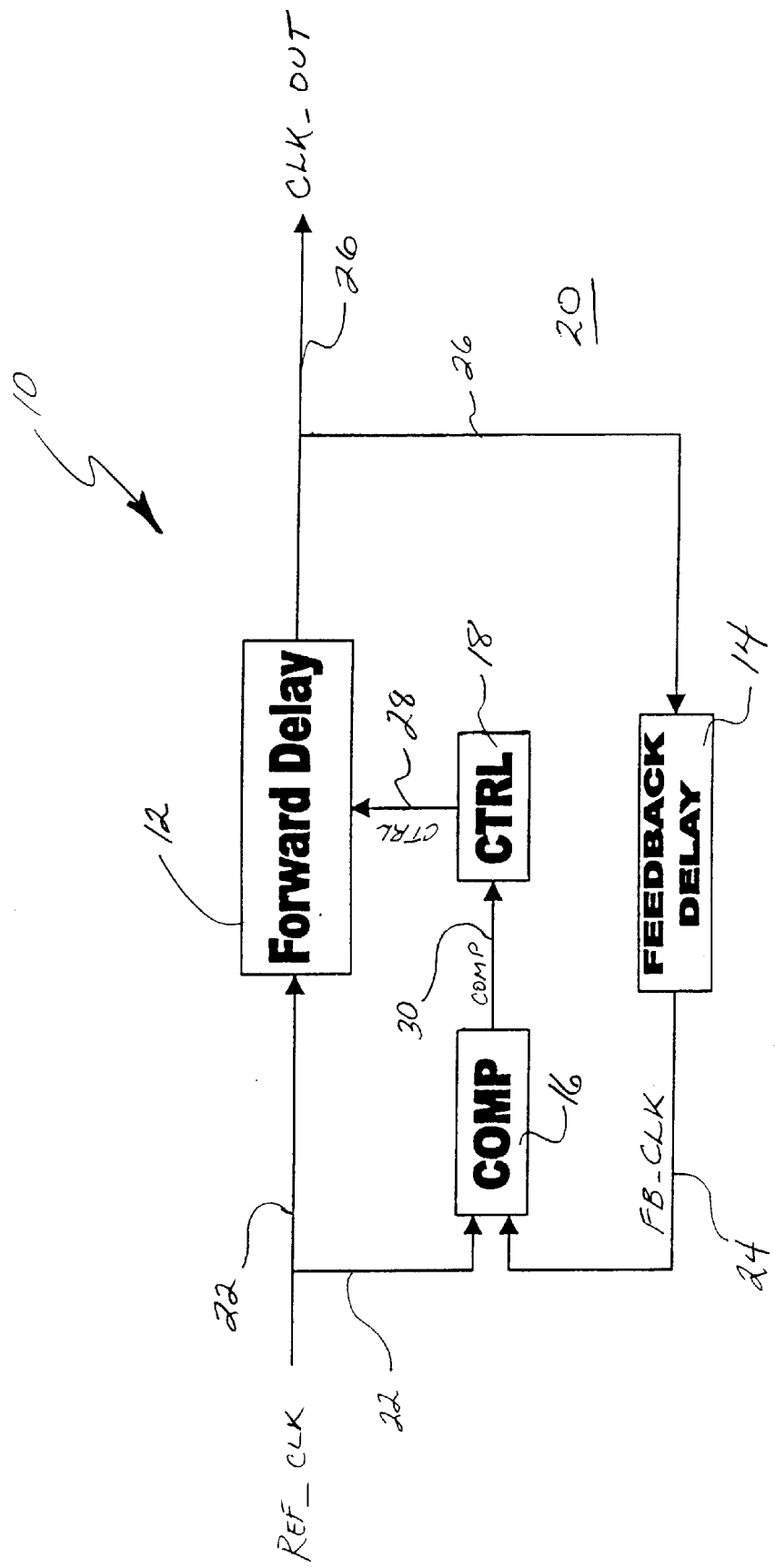
FIG. 1 is a block diagram of a conventional DLL.

Referring now to FIG. 1, a block diagram of a conventional DLL circuit is shown. DLL circuit 10 includes forward delay circuit 12, feedback delay circuit 14, compare circuit COMP 16 and control circuit CTRL 18. Typically, DLL circuit 10 is formed on a common substrate with, or is commonly packaged with and interconnected to, integrated circuit (IC) 20, such as, for example, a dynamic random access memory (DRAM) chip. Generally, DLL circuit 10 receives reference clock signal REF_CLK 22, compares REF_CLK 22 to a feedback clock signal FB_CLK 24, and issues output clock signal CLK_OUT 26 based at least in part upon the comparison. The comparison is iterated until REF_CLK signal 22 is aligned in time with the FB_CLK signal 24.

Forward delay circuit 12 is electrically connected to CTRL circuit 18 and receives therefrom CTRL signal 28. Forward delay circuit 12 receives REF_CLK signal 22 and issues CLK_OUT signal 26, which is generally a delayed version of REF_CLK signal 22. The amount of time by which forward delay circuit 12 delays CLK_OUT signal 26 relative to REF_CLK signal 22 is dependent at least in part upon CTRL signal 28. Forward delay circuit 12 includes a plurality of delay elements (not shown), such as, for example, buffers or invertors, connected in series. Each of the delay elements has a delay time of one unit delay, or $t_u$. A unit delay can be any period of time appropriate to the application of DLL 10, such as, for example, tens, hundreds or thousands of picoseconds, or longer.

Feedback delay circuit 14 is electrically connected to forward delay circuit 12 and receives therefrom CLK_OUT 26. Feedback delay circuit 14 is further electrically connected to compare circuit COMP 16, and issues thereto FB_CLK signal 24, which is generally a delayed version of CLK_OUT 26. The FB_CLK signal 24 is delayed relative to CLK_OUT 26 by a feedback delay time, $t_{FB}$. The feedback delay time $t_{FB}$ is, for example, substantially equal to the propagation delay $t_p$ of the REF_CLK signal 22 through IC 20. Feedback delay circuit 14 includes one or more delay elements (not shown), such as, for example, buffers or inverters, that delay FB_CLK signal 24 relative to the CLK_OUT signal 26 by feedback time $t_{FB}$. Feedback delay circuit, via feedback delay time $t_{FB}$, models the propagation delay through IC 20 across a predefined range of operating conditions and parameters.

Compare circuit COMP 16 receives REF_CLK signal 22 and FB_CLK signal 24. Compare circuit 16 compares REF_CLK signal 22 to FB_CLK signal 24, and issues COMP signal 30 to control circuit CTRL 18. Compare circuit COMP 16 is conventional in construction and design, such as, for example, a phase detector, and is known to those skilled in the art. COMP signal 30 is indicative of the phase of REF_CLK signal 22 relative to FB_CLK signal 24, and thus indicates whether REF_CLK signal 22 leads or lags FB_CLK signal 24.

Control circuit CTRL 18 is electrically connected to COMP circuit 16 and to forward delay circuit 12. CTRL circuit 18 issues CTRL signal 28 to forward delay circuit 12, and receives COMP signal 30 from COMP circuit 16. Dependent at least in part upon COMP signal 30, CTRL circuit 18 adjusts CTRL signal 28 to thereby increase, decrease or leave unchanged the amount of time by which forward delay circuit 12 delays CLK_OUT signal 26 relative to REF_CLK signal 22, i.e., CTRL signal 28 adjusts the length of the forward delay line of forward delay circuit 12. Control circuit CTRL 18 is configured, for example, as a shift register which causes stored data to move to the right or left one bit position based on the phase difference between REF_CLK signal 22 and FB CLK signal 24, as will be appreciated by those skilled in the art.

In use, REF_CLK signal 22 is provided to DLL circuit 10 by, for example, an external clock network (not shown). Upon startup, DLL circuit 10 is reset such that forward delay circuit 12 introduces substantially no delay. REF_CLK signal 22 is thus essentially passed undelayed through forward delay circuit 12. CLK_OUT signal 26, i.e., the undelayed version of REF_CLK signal 22 emerging from forward delay circuit 12, is provided to feedback delay circuit 14 which issues FB_CLK signal 24. FB_CLK signal 24 is delayed relative to REF_CLK signal 22 by $t_{FB}$. FB_CLK signal 24 is compared to REF_CLK signal 22 by compare circuit COMP 16. COMP circuit 16 determines the phase relationship of the signals and issues COMP signal 30, which is indicative of that phase relationship, to control circuit CTRL 18. Control circuit CTRL 18, in turn, issues CTRL signal 28 to adjust, if necessary, the length of the forward delay line of forward delay circuit 12. Assuming the REF_CLK 22 and FB_CLK 24 signals are exactly in phase, CTRL signal 28 sets forward delay circuit 12 to hold the current delay state of CLK_OUT signal 26 relative to REF_CLK signal 22. Thus, CLK_OUT 26 of DLL 10 is initially aligned with the propagation delay of IC 20. As the operating conditions of IC 20 change, and the propagation delay $t_p$ thereof increases or decreases, $t_{FB}$ changes accordingly. The above-described comparison of REF_CLK signal 22 with FB_CLK signal 24 is repeated, with the change in $t_p$ being tracked by a corresponding change in $t_{FB}$. The change in $t_{FB}$ correspondingly alters the delay of FB_CLK signal 24, and thus the length of time by which forward delay circuit 12 delays CLK_OUT 26 relative to REF_CLK signal 22 tracks the change in $t_p$.

Figure 2:
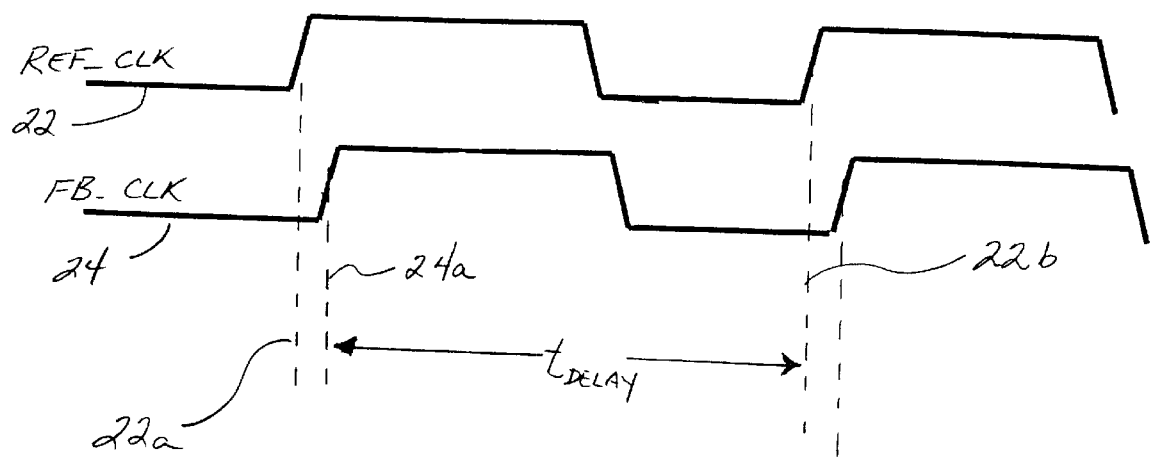
FIG. 2 is a timing diagram showing the worst-case relationship between a reference clock signal and a feedback clock signal applied to a conventional DLL.

In order to have the capability to time-align the clocks in all cases, the delay line of forward delay circuit 12 must be able to increase the delay of CLK_OUT signal 26 up to the length of the cycle time of the lowest operational frequency of REF_CLK signal 22 and/or IC 20. Referring now to FIG. 2, a worst case scenario for the alignment of the FB_CLK signal 24 and REF_CLK signal 22 is shown. With REF_CLK signal 22 at a logical high state when the rising edge 24a of FB_CLK signal 24 occurs, the forward delay necessary to align FB_CLK signal 24 with REF_CLK signal 22, as indicated by $t_{DELAY}$, can approach the entire period of REF_CLK signal 22. More particularly, this worst case scenario exists when the rising edge 22a of REF_CLK signal 22 slightly precedes or leads the rising edge 24a of FB_CLK signal 24. In order to align the clocks in this situation, FB_CLK 24 signal must be delayed such that rising edge 24a thereof coincides with the next rising edge 22b of REF_CLK signal 22. Thus, since FB_CLK signal 24 is a delayed version of CLK_OUT signal 26, CLK_OUT signal 26 must be delayed by a period of time $t_{DELAY}$ approaching, if not substantially equal to, the period of REF_CLK signal 22. Introducing such a relatively lengthy delay into CLK_OUT signal 26 requires forward delay circuit 12 to include a multitude of power-consuming delay elements and increases the amount of time required for DLL 10 to "lock", i.e., time-align the clock signals.

Figure 3:
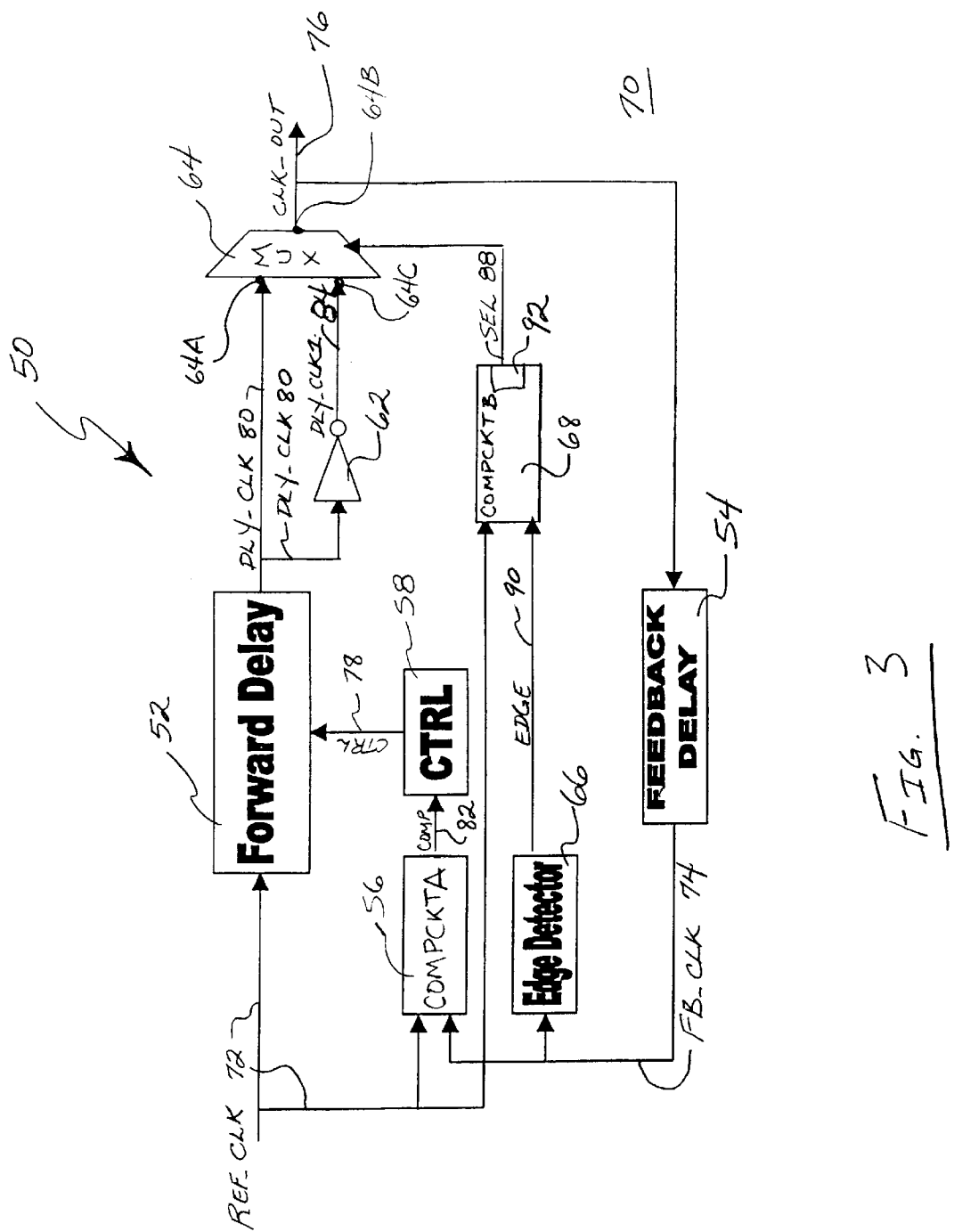
FIG. 3 is a block diagram of one embodiment of a DLL of the present invention.

Referring now to FIG. 3, a block diagram of one embodiment of a DLL of the present invention is shown. DLL 50 includes forward delay circuit 52, feedback delay circuit 54, comparator circuit COMPCKTA 56, and control circuit CTRL 58. DLL 50 further includes inverter 62, clock multiplexer 64, edge detector circuit 66, and COMPCKTB 68. DLL circuit 50 is formed, for example, on a common substrate with, or is commonly packaged with and interconnected to, integrated circuit (IC) 70, such as, for example, a dynamic random access memory (DRAM) chip. Generally, DLL circuit 50 receives reference clock signal REF_CLK 72, detects the rising edge of FB_CLK signal 74 during the start up of DLL 50, checks the logical state of REF_CLK 72, and then selectively inverts FB_CLK signal 74 to thereby decrease the amount of time by which output clock signal CLK_OUT 76 must be delayed. Thus, the length of the delay line of forward delay circuit 52 and, therefore, the power consumption of DLL 50 are substantially reduced.

Forward delay circuit 52 receives REF_CLK signal 72, and is interconnected with each of control circuit CTRL 58, inverter circuit 62, and clock multiplexer (MUX) 64. Forward delay circuit 52 issues intermediate delayed clock signal DLY_CLK signal 80, which is essentially a delayed version of REF_CLK signal 72. More particularly, forward delay circuit 52 is electrically connected to CTRL circuit 58, and receives therefrom CTRL signal 78. Forward delay circuit 52 issues DLY_CLK signal 80 to each of inverter 62 and input 64A of MUX 64. The amount of time by which forward delay circuit 52 delays DLY_CLK signal 80 relative to REF_CLK signal 72 is dependent at least in part upon CTRL signal 78. Forward delay circuit 52 includes a plurality of delay elements (not shown), such as, for example, buffers or invertors, electrically connected in series. Each of the delay elements has a delay time of one unit delay, or $t_U$. A unit delay can be any period of time appropriate to the application of DLL 50, such as, for example, tens, hundreds or thousands of picoseconds, or longer.

Feedback delay circuit 54 is electrically connected to output 64B of MUX 64 and receives therefrom CLK_OUT signal 76. Feedback delay circuit 54 is further electrically connected to compare circuit COMPCKTA 56 and to edge detecting circuit 66. Feedback delay circuit issues FB_CLK signal 74 to each of compare circuit COMPCKTA 56 and edge detecting circuit 66. FB_CLK signal 74 is essentially a delayed version of CLK_OUT signal 76. FB_CLK signal 74 is delayed relative to CLK_OUT signal 76 by a feedback delay time, $t_{FB}$. Feedback delay time $t_{FB}$ is substantially equal to the propagation delay $t_p$ of REF_CLK signal 72 through IC 70, and tracks changes in the propagation delay through IC 70 due to the aforementioned external factors. Thus, as the operating conditions and parameters of IC 70 change, feedback delay time $t_{FB}$ tracks any change in $t_p$. Feedback delay circuit 54 includes one or more delay elements (not shown) that delay FB_CLK signal 74 relative to CLK_OUT signal 76 by feedback time $t_{FB}$.

Compare circuit COMPCKTA 56 receives REF_CLK signal 72 and FB_CLK signal 74. COMPCKTA 56 compares REF_CLK signal 72 to FB_CLK signal 74, and issues COMP signal 82 to control circuit CTRL 58. Compare circuit COMPCKTA 56 is conventional in construction and design, such as, for example, a phase detector, and is known to those skilled in the art.

Control circuit CTRL 58 is electrically connected to COMPCKTA 56 and to forward delay circuit 52. CTRL circuit 58 receives COMP signal 82 from COMPCKTA 56, and issues CTRL signal 78 to forward delay circuit 52. Dependent at least in part upon COMP signal 82, CTRL circuit 58 adjusts CTRL signal 78 to thereby increase, decrease or leave unchanged the amount of time by which forward delay circuit 54 delays intermediate DLY_CLK signal 80 relative to REF_CLK signal 72. Control circuit CTRL. 58 is configured, for example, as a shift register which causes stored data to move to the right or left one bit position based on the difference between REF_CLK signal 72 and FB_CLK signal 74 as indicated by COMP signal 82, as will be appreciated by those skilled in the art.

Inverter 62 is electrically connected to forward delay circuit 54 and to input 64C of MUX 64. Inverter 62 receives DLY_CLK signal 80 from forward delay circuit 54 and issues DLY_CLK1 signal 84, which is an inverted version of DLY_CLK signal 80, to input 64C of MUX 64. Inverter 62 is of conventional construction and design.

Multiplexer MUX 64 has inputs 64A and 64C electrically connected to the output of forward delay circuit 52 and to the output of inverter 62, respectively. MUX 64 is also electrically connected to COMPCKTB 68, and receives therefrom select signal SEL 88. MUX 64, dependent at least in part upon SEL signal 88, selects which one of DLY_CLK signal 80 and DLY_CLK1 signal 84 is passed through to output 64B, and thereby becomes CLK_OUT signal 76 and the input signal to feedback delay circuit 54. MUX 64 is conventional in construction and design.

Edge detecting circuit 66 is electrically connected to feedback delay circuit 54, and receives therefrom FB_CLK signal 74. Edge detecting circuit 66 is also electrically connected to COMPCKTB 68, and issues thereto EDGE signal 90. EDGE signal 90 becomes active, such as, for example, a logic high, upon the detection by edge detecting circuit 66 of a rising edge on FB_CLK signal 74. Edge detecting circuit 66 is also of conventional design and construction.

COMPCKTB 68 is electrically connected to edge detecting circuit 66 and to MUX 64. More particularly, COMPCKTB 68 receives REF_CLK signal 72 and EDGE signal 90, and issues SEL signal 88 that is dependent at least in part upon a comparison of REF_CLK 72 and EDGE signal 90. COMPCKTB 68 additionally includes a conventional set/reset latch circuit 92 for use in the operation and start up of DLL 50 and from which SEL signal 88 is issued, as is more particularly described hereinafter.

In use, DLL 50 generally operates to selectively connect one of a delayed, non-inverted version of REF_CLK signal 72 (i.e., DLY_CLK signal 80) and a delayed, inverted version of REF_CLK signal 72 (i.e., DLY_CLK1 signal 84) to feedback delay circuit 54, and thereby reduce the length of the delay line necessary within forward delay circuit 52 to align the clocks under worse case conditions.

More particularly, during start up of DLL 50, latch 92 of COMPCKTB 68 is placed by a reset signal (not shown) into a predetermined state, such as, for example, a voltage level corresponding to a logic high, to thereby establish SEL signal 88 in a predetermined state, such as, for example, a logic high, to thereby select a predetermined or default one of DLY_CLK signal 80 and DLY_CLK1 signal 84 to be output as CLK_OUT signal 76 from output 64B of MUX 64. CLK_OUT signal 76 is fed back to feedback delay circuit 54, which issues FB_CLK signal 74. Thus, the input signal to feedback delay circuit 54 is one of DLY_CLK signal 80 and DLY_CLK1 signal 84 as selected by the operation of MUX 64 in response to SEL signal 88. Feedback delay circuit 54 delays by a feedback delay time $t_{FB}$ CLK_OUT signal 76, which is then issued as FB_CLK signal 74. FB_CLK signal 74 is received by COMPCKTA 56 and edge detector circuit 66. Edge detector 66 activates EDGE signal 90 when it detects the rising edge of FB_CLK signal 74. EDGE signal 90 is received by COMPCKTB 82 and is compared thereby to the level of REF_CLK signal 72 to determine the state of select signal SEL 88. SEL signal 88, in turn, determines which of DLY_CLK signal 80 or DLY_CLK signal 84 appears on output 64B of MUX 64 as CLK_OUT signal 76 and fed back as the input to feedback delay circuit 54.

Even more particularly, when edge detector circuit 66 detects the rising edge of FB_CLK signal 74, EDGE signal 88 becomes active, such as, for example, a logic high, and is received by COMPCKTB 68. COMPCKTB 68 then checks the level of REF_CLK signal 72. If REF_CLK signal 72 is at a logic low level, indicating that the rising edge thereof lags the rising edge of FB_CLK signal 74, an appropriate SEL signal 88 is issued to cause MUX 64 to select DLY_CLK signal 80 to be passed through to output 64B of MUX 64. Thus, DLY_CLK signal 80 is connected to the input of feedback delay circuit 54. Conversely, if COMCKTB determines that REF_CLK signal 72 is at a high logic voltage level, indicating the rising edge thereof leads the rising edge of FB_CLK signal 74, an appropriate SEL signal 88 is issued to cause MUX 64 to select DLY_CLK1 signal 84 to be passed through to output 64B of MUX 64. Thus, DLY_CLK1 signal 84 is connected to the input of feedback delay circuit 54. The selection of DLY_CLK1 signal 84 as the input to feedback delay circuit 54 effectively inverts FB_CLK signal 74 causing the leading edge thereof to lag REF_CLK signal 72 and reduces the delay between the rising edges of the two signals. The reduction in delay between the rising edges of the two signals, in turn, reduces the length of the delay line of forward delay circuit 52 that is required to align the signals.

By selecting between DLY_CLK signal 80 and DLY_CLK1 signal 84 to be output by MUX 64 as CLK_OUT signal 76 and thus as the input to feedback delay circuit 54, the maximum separation of the two signals REF_CLK 72 and FB_CLK 74 will be one-half cycle. Thus, forward delay circuit 52 of DLL 50 requires only approximately half the number of delay elements required by forward delay circuit 12 of DLL circuit 10.

After the above-described start-up process, which can be thought of as an initial step toward alignment of the signals, the process of finely aligning the two clocks begins. The delay of CLK_OUT signal 76 relative to REF_CLK signal 72 is then adjusted by COMPCKTA 56 which compares REF_CLK signal 72 to FB_CLK signal 74. Dependent at least partially upon the comparison of REF_CLK signal 72 to FB_CLK signal 74, COMPCKTA 56 issues COMP signal 82 to control circuit CTRL 58. Control circuit CTRL 58, in turn, issues CTRL signal 78 thereby adjusting the length of the delay line of forward delay circuit 52 through which REF_CLK signal 72 is routed. The process of comparing REF_CLK signal 72 to FB_CLK signal 74 and adjusting the length of the delay line of forward delay circuit 52 is iterative, and continues until DLL 50 obtains a "lock" (i.e., time alignment) between FB_CLK signal 74 and REF_CLK signal 72. Once a locked condition has been obtained, the process of comparing REF_CLK signal 72 to FB_CLK signal 74 and adjusting the length of the delay line of forward delay circuit 52 is on-going to ensure continued alignment of the clocks across a predefined range of operating conditions and parameters, thereby compensating for any change in the propagation delay of IC 70.

Edge detector circuit 66 and COMPCKTB 68 are optionally powered off once the start up sequence of DLL 50, i.e., the initial edge detection of FB_CLK signal 74 and issuance of SEL signal 88, has been completed. Thus, an additional reduction in power consumption is obtained.

The operation of DLL 50 is now contrasted with the operation of a conventional DLL circuit, such as DLL 10, under the worst-case operating scenario as described above and shown in FIG. 2. The worst case scenario, as shown in FIG. 2 exists when the rising edge 22a of REF_CLK signal 22 slightly precedes or leads the rising edge 24a of FB_CLK signal 24. In order to align the clocks in this worst-case scenario, the conventional DLL 10 must delay FB_CLK signal 24 such that rising edge 24a thereof coincides with the next rising edge 22b of REF_CLK signal 22. Thus, a conventional DLL must delay CLK_OUT signal 26, upon which FB_CLK signal 24 is based, by a period of time approaching, if not substantially equal to, the period of REF_CLK signal 22. Introducing such a relatively lengthy delay into CLK_OUT signal 26 requires forward delay circuit 12 to include a multitude of power-consuming delay elements and increases the amount of time required for DLL 10 to "lock", i.e., time-align the clock signals.

In contrast, under the same worst-case scenario as shown in FIG. 2, inverter 62, edge detector 66, COMPCKTB 68 and MUX 64 operate as described above to selectively invert the signal that is input to feedback delay circuit 54, thereby reducing the amount of time by which FB_CLK signal 74 must be delayed approximately in half. Accordingly, the length of the forward delay line of forward delay circuit 52 is also reduced approximately in half, thereby reducing the number of power-consuming delay elements and decreasing the amount of time required for DLL 50 to obtain a "lock" condition.

Figure 4:
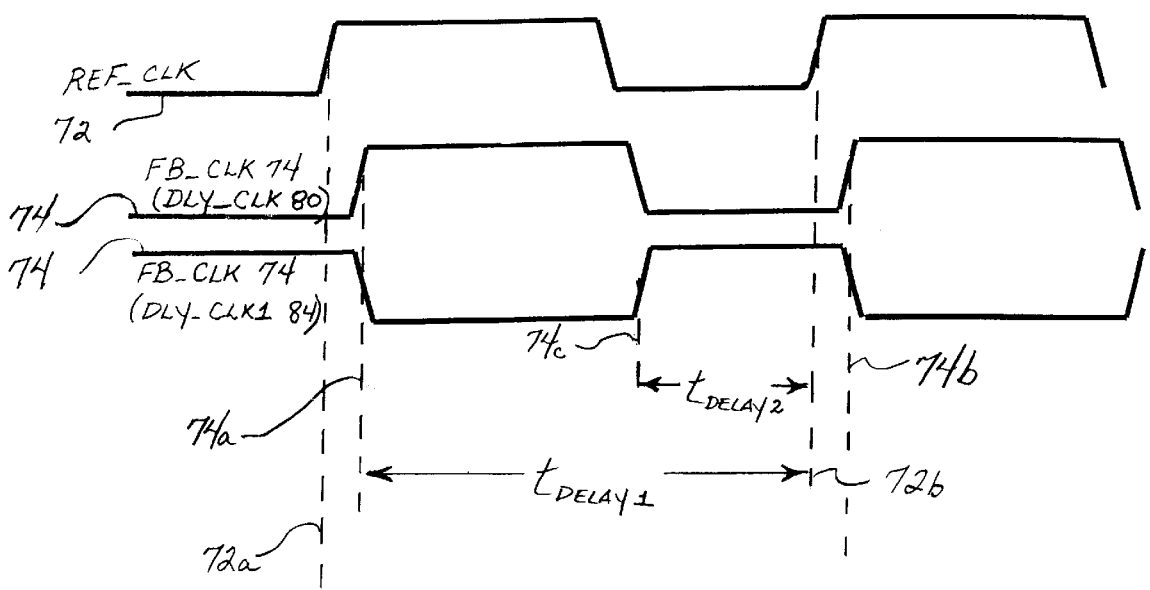
FIG. 4 is a timing diagram showing the operation of the DLL of the present invention a under the worst-case relationship between the reference clock signal and the feedback signal.

As shown in FIG. 4, the same worse case condition illustrated in FIG. 2 is now applied to DLL 50. DLL 50 is initially reset during start up to select a default one of signals DLY_CLK 80 and DLY_CLK1 84 to issue as CLK_OUT signal 76 on output 64B of MUX 64 and, in turn, be input to feedback delay circuit 52. Thus, FB_CLK signal 74 is essentially a delayed version of the default or selected one of signals DLY_CLK 80 and DLY_CLK1 84. This situation is depicted in FIG. 4 by showing two FB_CLK signals 74 that are distinguished from each other by a parenthetical indication of the corresponding input to feedback delay circuit 52. FB_CLK signal 74 with the parenthetical (DLY_CLK 80) thereafter corresponds to the input signal that is provided to feedback delay circuit 52 when DLY_CLK signal 80 is selected to issue on output 64B MUX 64, whereas FB_CLK signal 74 with the parenthetical (DLY_CLK1 84) thereafter corresponds to the input signal provided to feedback delay circuit 52 when DLY_CLK1 signal 84 is selected to issue on output 64B of MUX 64.

The operation of DLL 50 under the worst case scenario with DLY_CLK signal 80 selected by MUX 64 as the input signal to feedback delay circuit 54 results in substantially the same situation as shown in FIG. 2. More particularly, rising edge 72a of REF_CLK signal 72 slightly leads rising edge 74a of FB_CLK signal 74 (DLY_CLK 80). Thus, REF_CLK signal 72 is at a logic high voltage level when the rising edge 74a of FB_CLK signal 74 (DLY_CLK 80) occurs. In order to time-align the two signals with DLY_CLK signal 80 as the input to feedback delay circuit 52, rising edge 74a of FB_CLK signal 74 (DLY_CLK 80) would have to be delayed an amount of time $t_{DELAY1}$ in order to be aligned with rising edge 72b of REF_CLK signal 72. The time $t_{DELAY1}$ approaches the period of REF_CLK signal 72. Thus, if DLY_CLK signal 80 was the input to feedback delay circuit 54, forward delay circuit 52 would require the same multitude of power-consuming delay stages as does DLL 10. However, by selecting between DLY_CLK signal 80 and DLY_CLK1 signal 84 as the input to feedback delay circuit 54, DLL 50 reduces the lag between the rising edges of the two signals.

Under the worst case operating conditions shown in FIG. 4, DLL 50 selects DLY_CLK1 signal 84, rather than DLY_CLK signal 80, as the input to feedback delay circuit 54. Since DLY_CLK1 signal 84 is the inverted version of DLY_CLK signal 80 the amount of time by which FB_CLK signal 74 must be delayed and the time required to align the signals are substantially reduced. More particularly, the time difference between rising edge 72b of REF_CLK signal 72 and the rising edge 74c of FB_CLK signal 74 (DLY_CLK1 signal 84) is substantially reduced under this worst case scenario when DLY_CLK1 signal 84 is selected by MUX 64 as the input signal to feedback delay circuit 52. The time difference $t_{DELAY2}$ between rising edge 72b of REF_CLK signal 72 and rising edge 74c of FB_CLK signal 74 (DLY_CLK1 84) is approximately one-half the period of REF_CLK signal 72. Thus, by selecting DLY_CLK1 signal 84 as the input to feedback delay circuit 54, DLL 50 has cut the separation between the two signals approximately in half relative to DLL 10 under the same operating conditions. Accordingly, forward delay circuit 52 requires far fewer power-consuming delay stages and achieves alignment of the signals in a substantially reduced amount of time.

In the embodiment shown, the delay lock loop circuit of the present invention is described as being for use with relatively large ICs, such as, for example, memory chips and programmable logic arrays. However, it is to be understood that the delay lock loop circuit of the present invention can be used in any other IC that requires or could benefit from clock skew adjustment.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed:

1. A delay lock loop circuit receiving a reference clock signal, said delay lock loop (DLL) circuit aligning in time the reference clock signal and an internal feedback clock signal for generating an output clock signal, said DLL circuit comprising:

a forward delay circuit receiving said reference clock signal, said forward delay circuit issuing a delayed clock signal, said forward delay circuit adjustably shifting in time said delayed clock signal relative to said reference clock signal;

an inverter receiving said delayed clock signal, said inverter issuing an inverted delayed clock signal that is the inverse of said delayed clock signal;

selecting means having a first input connected to said forward delay circuit for receiving said delayed clock signals, a second input connected to said inverter for receiving said inverted delayed clock signals and means for selecting one of the two inputs as a selecting means output;

a clock signal output connected to the selecting means output for issuing the selected one of said delayed and said inverted delayed clock signals as said output clock signal; and a feedback delay circuit connected to said output of said selecting means for receiving a selected one of said delayed and said inverted delayed clock signals, and issuing said feedback clock signal, said feedback clock signal being shifted in time relative to said selected one of said delayed and said inverted delayed clock signals.

2. A delay lock loop circuit receiving a reference clock signal, said delay lock loop (DLL) circuit aligning in time the reference clock signal and an internal feedback clock signal, said DLL circuit comprising:

a forward delay circuit receiving said reference clock signal, said forward delay circuit issuing a delayed clock signal, said forward delay circuit adjustably shifting in time said delayed clock signal relative to said reference clock signal;

an inverter receiving said delayed clock signal, said inverter issuing an inverted delayed clock signal that is the inverse of said delayed clock signal; and a feedback delay circuit receiving a selected one of said delayed and said inverted delayed clock signals, and issuing said feedback clock signal, said feedback clock signal being shifted in time relative to said selected one of said delayed and said inverted delayed clock signals;

comparing means comparing said feedback clock signal to said reference clock signal, said comparing means issuing a select signal, said select signal indicative of the time shift of said feedback clock signal relative to said reference clock signal; and a multiplexer receiving each of said delayed and said inverted delayed clock signals and said select signal, said multiplexer connecting one of said delayed and said inverted delayed clock signals to said feedback delay circuit dependent at least in part upon said select signal.

3. The delay lock loop circuit of claim 2, wherein said comparing means includes an edge detector circuit, said edge detector circuit receiving said feedback clock signal and issuing an edge signal indicative of the occurrence of a rising edge of said feedback clock signal.

4. The delay lock loop circuit of claim 3, wherein said comparing means further includes a comparing circuit, said comparing circuit receiving said reference clock signal and said edge signal, said comparing circuit issuing said select signal.

5. The delay lock loop circuit of claim 4, wherein said select signal causes said multiplexer circuit to connect said delayed clock signal to said feedback delay circuit when said edge signal indicates said rising edge of said feedback clock signal has occurred and said reference clock is at a voltage level corresponding to a logic low level.

6. The delay lock loop circuit of claim 4, wherein said select signal causes said multiplexer circuit to connect said inverted delayed clock signal to said feedback delay circuit when said edge signal indicates said rising edge of said feedback clock signal has occurred and said reference clock is at a voltage level corresponding to a logic high level.

7. An integrated circuit having a substrate, said integrated circuit comprising:

a delay lock loop (DLL) circuit being at least one of integrally formed on said substrate and electrically interconnected with said integrated circuit, said DLL circuit receiving a reference clock signal and aligning in time the reference clock signal with an internal feedback clock signal for generating an output clock signal, said DLL circuit including:

a forward delay circuit receiving said reference clock signal, said forward delay circuit issuing a delayed clock signal, said forward delay circuit adjustably shifting in time said delayed clock signal relative to said reference clock signal;

an inverter receiving said delayed clock signal, said inverter issuing an inverted delayed clock signal that is the inverse of said delayed clock signal;

selecting means having a first input connected to said forward delay circuit for receiving said delayed clock signals, a second input connected to said inverter for receiving said inverted delayed clock signals and means for selecting one of the two inputs as a selecting means output;

a clock signal output connected to the selecting means output for issuing the selected one of said delayed and said inverted delayed clock signals as said output clock signal; and a feedback delay circuit connected to said output of said selecting mans for receiving said selected one of said delayed and said inverted delayed clock signals, and issuing said feedback clock signal, said feedback clock signal being shifted in time relative to said selected one of said delayed and said inverted delayed clock signals.

8. The delay lock loop circuit of claim 7, further comprising selecting means, said selecting means selecting which of said delayed and said inverted delayed clock signals is received by said feedback delay circuit and issues as said output clock signal.

9. An integrated circuit having a substrate, said integrated circuit comprising:

a delay lock loop (DLL) circuit being at least one of integrally formed on said substrate and electrically interconnected with said integrated circuit, said DLL circuit receiving a reference clock signal and aligning in time the reference clock signal with an internal feedback clock signal, said DLL circuit including:

a forward delay circuit receiving said reference clock signal, said forward delay circuit issuing a delayed clock signal, said forward delay circuit adjustably shifting in time said delayed clock signal relative to said reference clock signal;

an inverter receiving said delayed clock signal, said inverter issuing an inverted delayed clock signal that is the inverse of said delayed clock signal;

a feedback delay circuit receiving a selected one of said delayed and said inverted delayed clock signals, and issuing said feedback clock signal, said feedback clock signal being shifted in time relative to said selected one of said delayed and said inverted delayed clock signals;

comparing means comparing said feedback clock signal to said reference clock signal, said comparing means issuing a select signal, said select signal indicative of the time shift of said feedback clock signal relative to said reference clock signal; and a multiplexer receiving each of said delayed and said inverted delayed clock signals and said select signal, said multiplexer connecting one of said delayed and said inverted delayed clock signals to said feedback delay circuit dependent at least in part upon said select signal.

10. The delay lock loop circuit of claim 9, wherein said comparing means includes an edge detector circuit, said edge detector circuit receiving said feedback clock signal and issuing an edge signal indicative of the occurrence of a rising edge of said feedback clock signal.

11. The delay lock loop circuit of claim 10, wherein said comparing means further includes a comparing circuit, said comparing circuit receiving said reference clock signal and said edge signal, said comparing circuit issuing said select signal.

12. A method for aligning in time a reference clock signal with a feedback clock signal for issuing an output clock signal, said feedback clock signal being delayed in time relative to the reference clock signal to thereby simulate a propagation delay of an integrated circuit, said method comprising:

receiving the reference clock signal;

issuing a delayed clock signal that is adjustably delayed by a forward delay time relative to the reference clock signal;

inverting said delayed clock signal to thereby create an inverted delayed clock signal;

selecting one of said delayed clock signal and said inverted delayed clock signal to issue as said output clock signal;

issuing said output clock signal;

delaying by a feedback delay time the output clock signal to thereby create a feedback clock signal;

comparing said feedback clock signal to said reference clock signal; and adjusting the forward delay time of said delayed clock signal dependent at least in part upon said comparing step; and repeating said comparing and adjusting steps to thereby align in time said reference clock signal and said feedback clock signal.

13. A method for aligning in time a reference clock signal with a feedback clock signal, said feedback clock signal being delayed in time relative to the reference clock signal to thereby simulate a propagation delay of an integrated circuit, said method comprising:

receiving the reference clock signal;

issuing a delayed clock signal that is delayed by a forward delay time relative to the reference clock signal;

inverting said delayed clock signal to thereby create an inverted delayed clock signal;

initially issuing a default one of said delayed clock signal and said inverted delayed clock signal as the output clock signal;

detecting a rising edge of the resultant feedback clock signal;

checking a state of the reference clock signal;

issuing said inverted delayed clock signal as the output clock signal where a rising edge of the feedback clock signal is detected and the state of the reference clock signal is a logic high;

issuing said delayed clock signal as the output clock signal where a rising edge of the feedback clock signal is detected and the state of the reference clock signal is a logic low level;

delaying by a feedback delay time the output clock signal to thereby create a feedback clock signal;

comparing said feedback clock signal to said reference clock signal;

adjusting the forward delay time of said delayed clock signal dependent at least in part upon said comparing step; and repeating said comparing and adjusting steps to thereby align in time said reference clock signal and said feedback clock signal.

* * * * *